US008731501B2

(12) United States Patent
Cooley

(10) Patent No.: US 8,731,501 B2
(45) Date of Patent: May 20, 2014

(54) SYSTEMS AND METHODS FOR TUNING A BROADCAST RADIO RECEIVER WITH DIGITAL DISPLAY

(75) Inventor: Daniel Cooley, Forney, TX (US)

(73) Assignee: Silicon Laboratories Inc., Austin, TX (US)

( * ) Notice: Subject to any disclaimer, the term of this patent is extended or adjusted under 35 U.S.C. 154(b) by 782 days.

(21) Appl. No.: 12/586,886

(22) Filed: Sep. 29, 2009

(65) Prior Publication Data

US 2011/0076972 A1    Mar. 31, 2011

(51) Int. Cl.
 H04B 1/18   (2006.01)
 H04B 1/06   (2006.01)
 H04B 7/00   (2006.01)
 H04B 1/38   (2006.01)

(52) U.S. Cl.
 USPC ............... 455/154.1; 455/147; 455/154.2; 455/255; 455/566

(58) Field of Classification Search
 USPC ............ 455/147, 182.1–182.2, 183.1–183.2, 455/192.1–192.2, 196.1–197.1, 258, 318, 455/154.1, 514.2, 255–257, 566
 See application file for complete search history.

(56) References Cited

U.S. PATENT DOCUMENTS

| | | | | |
|---|---|---|---|---|
| 4,921,467 A * | 5/1990 | Lax | | 455/264 |
| 5,757,244 A * | 5/1998 | Nonaka et al. | | 331/176 |
| 5,777,524 A * | 7/1998 | Wojewoda et al. | | 331/116 R |
| 5,848,355 A * | 12/1998 | Rasor | | 455/260 |
| 5,875,388 A * | 2/1999 | Daughtry et al. | | 455/67.11 |
| 5,953,640 A * | 9/1999 | Meador et al. | | 455/73 |
| 6,026,278 A * | 2/2000 | Suzuki | | 340/7.34 |
| 6,148,187 A * | 11/2000 | Chiba | | 455/192.2 |
| 6,215,990 B1 * | 4/2001 | Kidd | | 455/255 |
| 6,757,527 B1 * | 6/2004 | Dahlback et al. | | 455/255 |
| 6,882,835 B2 * | 4/2005 | Oka et al. | | 455/260 |
| 7,003,273 B1 * | 2/2006 | Shimanuki et al. | | 455/255 |
| 7,148,754 B2 * | 12/2006 | Kaminski | | 331/11 |
| 7,209,013 B2 * | 4/2007 | Norman et al. | | 331/65 |
| 7,239,857 B2 * | 7/2007 | Abraham | | 455/255 |
| 7,332,975 B2 | 2/2008 | Marques | | |
| 7,542,445 B2 * | 6/2009 | Berggren | | 370/328 |
| 7,689,191 B2 * | 3/2010 | Kimura et al. | | 455/260 |
| 7,855,608 B2 * | 12/2010 | Babitch | | 331/66 |
| 8,040,178 B2 * | 10/2011 | Tsukio et al. | | 329/325 |
| 2004/0058663 A1 * | 3/2004 | Elder et al. | | 455/319 |
| 2004/0219893 A1 * | 11/2004 | Takano et al. | | 455/114.3 |
| 2006/0148416 A1 * | 7/2006 | Harasawa et al. | | 455/71 |

(Continued)

OTHER PUBLICATIONS

Tadayon, "Mechanical Tuning of a Radio", U.S. Appl. No. 12/231,184, filed Aug. 29, 2008, 20 pgs.

Primary Examiner — Simon Nguyen
(74) Attorney, Agent, or Firm — Egan, Peterman & Enders LLP.

(57) ABSTRACT

Systems and methods that employ receiver circuitry to provide frequency display signals to a digital display without the presence or use of any external timing reference. One or more properties of a controllable local oscillator of a receiver circuit may be heavily or extensively characterized by measuring the local oscillator frequency under a variety of temperature and process conditions, and minimum to maximum frequencies. Measured local oscillator characterization information may be stored in memory, and may be accessed and used during normal operation to control the controllable local oscillator to produce a desired oscillator frequency for tuning the receiver circuitry to a desired radio frequency and for producing digital frequency display signals that are representative of the tuned radio frequency.

37 Claims, 5 Drawing Sheets

(56) References Cited

U.S. PATENT DOCUMENTS

| | | | |
|---|---|---|---|
| 2006/0202771 A1* | 9/2006 | Seki et al. | 331/158 |
| 2006/0258313 A1* | 11/2006 | Uozumi et al. | 455/252.1 |
| 2007/0178848 A1* | 8/2007 | Han | 455/76 |
| 2007/0213028 A1* | 9/2007 | Shohara et al. | 455/343.1 |

\* cited by examiner

US 8,731,501 B2

SYSTEMS AND METHODS FOR TUNING A BROADCAST RADIO RECEIVER WITH DIGITAL DISPLAY

FIELD OF THE INVENTION

This invention relates generally to radio receivers, and more particularly to radio receiver tuning and display of tuned frequency information.

BACKGROUND OF THE INVENTION

In broadcast radio systems using a digital display, the system uses some type of timing reference, usually in the form of an external crystal oscillator or reference clock attached to the radio or somewhere else in the system. For example, FIG. 1 illustrates a prior art radio receiver system 100 including a fully integrated complementary metal oxide semiconductor (CMOS) single die integrated receiver circuit 102 that is coupled to receive analog radio frequency (RF) signals from an external antenna 104, and to provide analog audio signals to a speaker device.

As shown in FIG. 1, incoming analog RF signals are provided to low noise amplifier (LNA) 106, which in turn provides amplified RF signals to mixer circuitry 108 where a selected frequency of the incoming RF signals is downconverted to a lower frequency (e.g. a low intermediate frequency) by mixing with a signal output from local oscillator in the form of voltage controlled oscillator (VCO) circuitry 122. The frequency of VCO circuitry 122, is controlled by an automatic frequency control circuit (AFC) 127 which receives an incoming clock signal from an external (i.e., off-chip) crystal oscillator 128 and on-chip crystal oscillator core 126 as shown. The downconverted signal is then provided to analog-to-digital conversion circuitry (ADC) 112 through low-pass filter circuitry 110 to remove upconverted high frequency energy produced in mixer circuitry 108. ADC 112 in turn provides a digitized signal to digital signal processor (DSP) circuitry 114, which performs signal processing and/or demodulation operations to obtain the message content in the incoming signal. The digitized message information is then provided to digital-to-analog conversion (DAC) circuitry 116, which provides analog output audio signals to external speakers.

As further shown in FIG. 1, an on-chip microcontroller (MCU) 120 is coupled to control fine tuning of VCO 122 based on digital RF tuning control signals that may be received directly from an external MCU 118 that responds to manual tuning input from a user. On-chip MCU 120 controls the fine tuning of VCO 122 based on the digital tuning control signals to enable the receiver circuit 102 to tune to the desired RF channel. As shown in FIG. 1, frequency counter 124 uses the incoming clock signal from external crystal oscillator 128 and on-chip crystal oscillator core 126 to measure the tuned frequency of VCO 122, and outputs this measured frequency information to an on-chip display controller 130. On-chip display controller 130 in turn provides frequency display signals to off-chip digital display 132, which displays the identity of the tuned frequency to the user.

One variation of generating a local oscillator signal is to wrap a phase-locked loop (PLL) around a VCO for frequency control. PLL synthesizers require crystal oscillators to keep the timing in the system.

SUMMARY OF THE INVENTION

Disclosed herein are systems and methods that employ receiver circuitry to provide frequency display signals to a digital display without the presence or use of any external timing reference (e.g., such as external microcontroller unit, crystal oscillator, reference clock, etc.). In one embodiment, one or more properties of a controllable local oscillator of a receiver circuit may be heavily or extensively characterized (e.g., prior to shipping the product) by using an external timing reference to measure the local oscillator frequency under a variety of conditions, e.g., such as temperature and voltage, and minimum to maximum frequencies. This measured oscillator characterization information may then be stored in programmable memory of the receiver circuit. During normal operation, an internal controller of the receiver circuit or other processor may then run an algorithm that accesses the stored oscillator characterization information and uses this information to control the controllable local oscillator to produce a desired oscillator frequency by compensating for changing operating conditions that may include conditions of temperature and process (e.g., power supply voltage, resistor manufacturing variation, capacitor manufacturing variation, and transistor manufacturing variation etc.). This produced oscillator frequency may then be used to tune the receiver circuitry (e.g., single chip on-board receiver circuitry) to a desired RF frequency and to produce digital frequency display signals that are representative of the identity of the tuned RF frequency of the receiver circuitry. The disclosed systems and methods may thus be implemented to provide a digital display without requiring an external timing reference or other timing reference in the receiver system (e.g., to provide a crystal-less or reference-less system), reducing system bill of materials (BOM), costs, board area and system complexity.

In one respect, disclosed herein is a receiver circuit including: mixer circuitry configured to receive a radio frequency (RF) signal and to mix the RF signal with a local oscillator (LO) signal to produce a downconverted signal; LO circuitry coupled to provide the LO signal to the mixer to produce the downconverted signal; at least one processing device configured to receive a RF tuning control signal representative of a selected radio frequency, the processing device being coupled to the LO circuitry and coupled to control the frequency of the LO signal with an oscillator control value operable to downconvert to the selected radio frequency, the oscillator control value being selected based at least in part on measured temperature; and memory circuitry coupled to the at least one processing device, the memory circuitry containing oscillator control information that includes the oscillator control value corresponding to the selected radio frequency at the measured temperature. The at least one processing device may be configured to access the memory circuitry and to select the oscillator control value based at least in part on the measured temperature, and may be further configured to output a digital display signal based on the selected radio frequency without consideration of an external timing reference, the digital display signal containing digital display information that represents the identity of the radio frequency of the downconverted signal.

In another respect, disclosed herein is a receiver system, including: at least one antenna configured to receive radio frequency (RF) signals; a tuning mechanism configured to accept RF tuning input from a user; a digital display device configured to display the identification of a selected radio frequency; receiver circuitry coupled to the antenna, tuning mechanism and digital display. The receiver circuitry may include: mixer circuitry configured to receive a RF signal provided by the antenna and to mix the RF signal with a local oscillator (LO) signal to produce a downconverted signal, LO circuitry coupled to provide the LO signal to the mixer to produce the downconverted signal, at least one processing device configured to receive a RF tuning control signal representative of a selected radio frequency input by a user via the tuning mechanism, the processing device being coupled to the LO circuitry and coupled to control the frequency of the LO signal with an oscillator control value operable to downconvert to the selected radio frequency, the oscillator control value being selected based at least in part on measured temperature, and memory circuitry coupled to the at least one processing device, the memory circuitry containing oscillator control information that includes the oscillator control value corresponding to the selected radio frequency at the measured temperature. The at least one processing device may be configured to access the memory circuitry and to select the oscillator control value based at least in part on the measured temperature, and may be further configured to output a digital display signal to the digital display device based on the selected radio frequency without consideration of an external timing reference, the digital display signal containing digital display information causing the digital display device to display the identity of the radio frequency of the downconverted signal.

In yet another respect, disclosed herein is a method of displaying the identity of a tuned radio frequency, including: receiving a RF tuning input, the tuning input being representative of a selected radio frequency; mixing a received RF signal with a local oscillator (LO) signal to produce a downconverted signal; selecting an oscillator control value based at least in part on measured temperature from oscillator control information that includes the oscillator control value corresponding to the selected radio frequency at the measured temperature; controlling the frequency of the LO signal with the selected oscillator control value to downconvert to the selected radio frequency; and outputting a digital display signal based on the selected radio frequency without consideration of a timing reference, the digital display signal containing digital display information that represents the identity of the radio frequency of the downconverted signal.

DESCRIPTION OF ILLUSTRATIVE EMBODIMENTS

Figure 1:
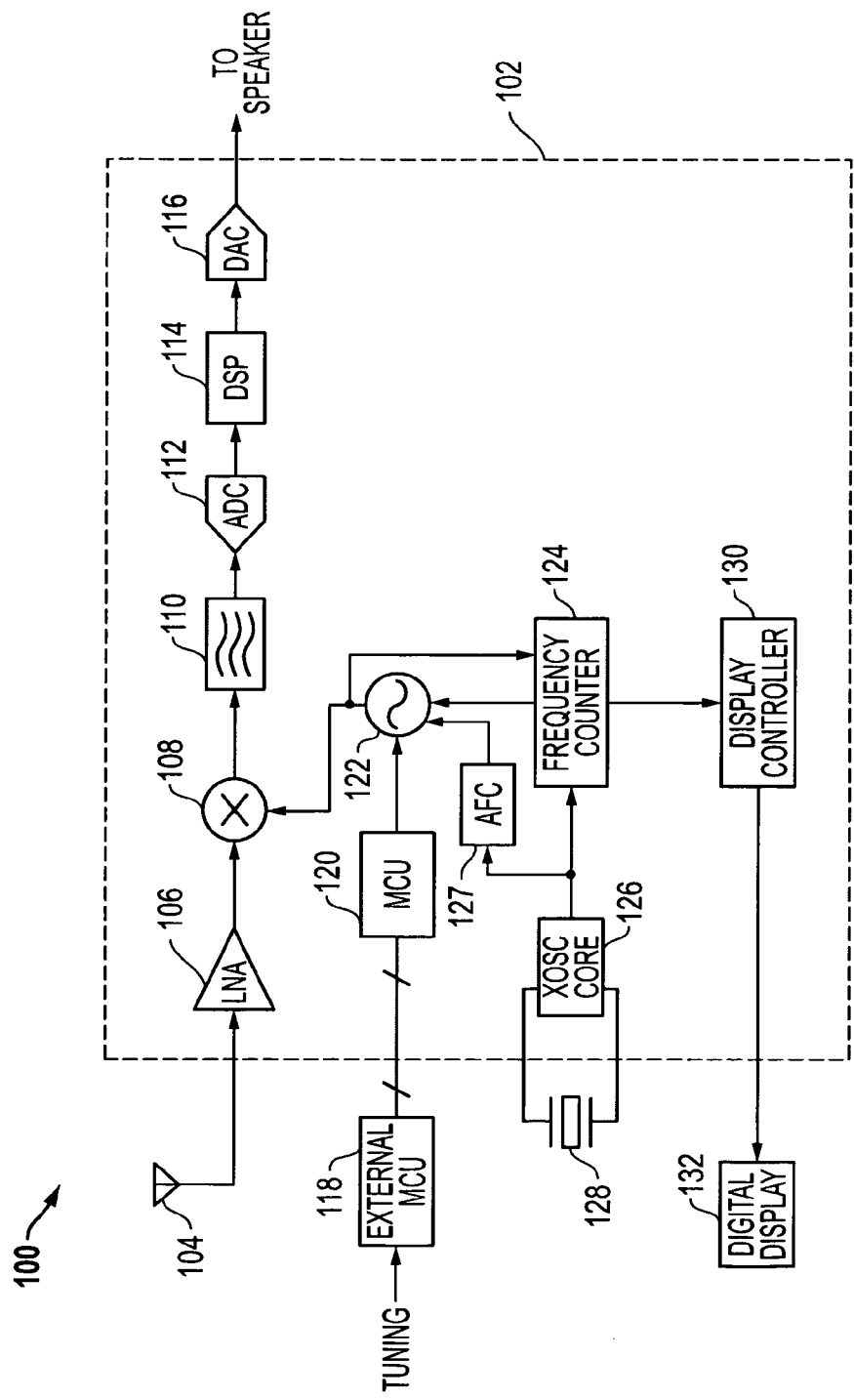
FIG. 1 is simplified block diagram of a prior art radio receiver system.
Figure 2:
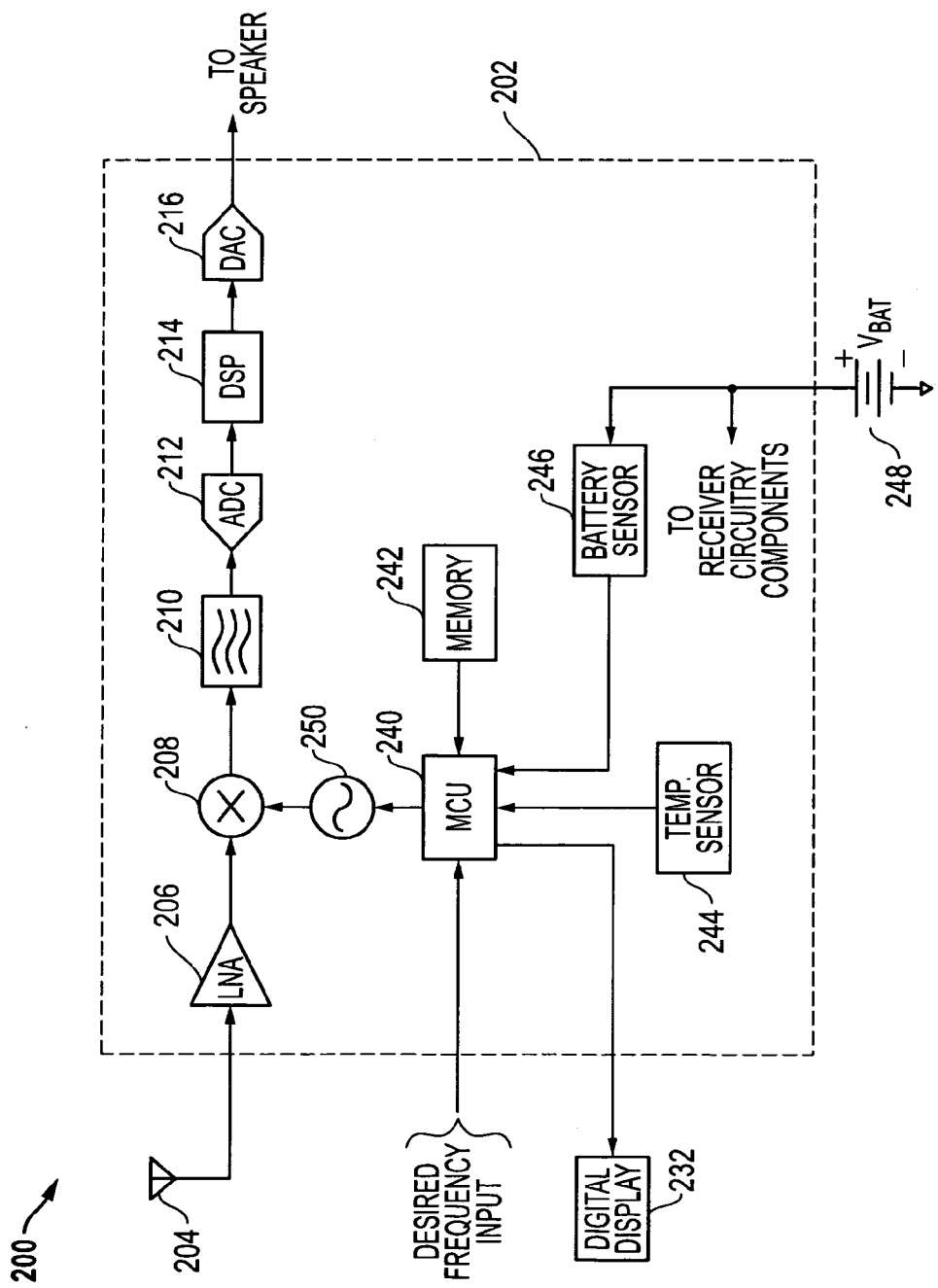
FIG. 2 is a simplified block diagram of a radio receiver system according to one exemplary embodiment of the disclosed systems and methods.

FIG. 2 illustrates one embodiment of a radio receiver system 200 including a fully integrated complementary metal oxide semiconductor (CMOS) single die integrated receiver circuit 202 that is coupled to receive analog radio frequency (RF) signals from an external antenna 204, and to provide analog audio signals to a speaker device. In the practice of the disclosed systems and methods, a receiver system 200 may be implemented as part of any radio system device having a digital display, e.g., such as a clock radio system, automobile radio system, AM receiver system, FM receiver system, short wave radio system, long wave radio system, aviation radio system, etc. A receiver system 200 may also be implemented as part of a multimedia device, such as MP3 player, cellular telephone or personal data assistant (PDA), etc.

Although a single die integrated receiver circuit 202 is illustrated and described in FIG. 2, it will be understood that the disclosed systems and methods may be implemented with circuitry configurations that employ multiple die and/or other combinations of external (i.e., off-chip) and/or internal (i.e., on-chip) receiver circuitry. Further information on receiver systems and receiver circuitry that may be implemented in the practice of the disclosed systems and methods may be found in U.S. patent application Ser. No. 12/231,184, entitled "Mechanical Tuning of a Radio" by Tadayon, filed Aug. 29, 2008, which is incorporated herein by reference in its entirety.

As shown in FIG. 2, incoming analog RF signals are provided to low noise amplifier (LNA) 206, which in turn provides amplified RF signals to mixer circuitry 208 where a selected frequency of the RF signals are downconverted to a lower frequency (e.g. a low intermediate (low-IF) frequency of about 128 kHz) by mixing with a signal output from local oscillator in the form of free running controllable local oscillator (LO) circuitry 250. The frequency of LO circuitry 250 is controlled by on-chip microcontroller (MCU) 240 in a manner that will be described further herein based at least in part on sensed temperature and one or more optional process parameters such as power supply (e.g., battery) voltage. The downconverted signal is then provided to analog-to-digital conversion (ADC) circuitry 212 through low-pass filter circuitry 210 to reject upconverted high frequency energy produced in mixer circuitry 208. Low-pass filter circuitry 210 may be a passive or active filter, for example, RC network, bandpass programmable gain amplifier (PGA) with a bandwidth of approximately 1 MHz, etc. ADC circuitry 212 in turn provides a digitized signal to digital signal processor (DSP) circuitry 214, which performs signal processing and/or demodulation operations to obtain the message content in the incoming signal. The digitized message information is then provided to digital-to-analog conversion (DAC) circuitry 216, which provides analog output audio signals to external speakers or other audio reproduction, storage or processing device. It will be understood that FIG. 2 is exemplary only, and that the disclosed systems and methods may be implemented with receiver circuitry configurations that downconvert and/or further process incoming RF signals in other manners including, for example, circuitry configurations that downconvert RF signals to intermediate frequency (IF), downconvert to zero-IF frequency, downconvert to baseband frequency, etc.

Still referring to FIG. 2, a desired frequency is provided by a user to receiver circuit 202 via a tuning mechanism, e.g., as external digital tuning control signals provided directly to on-chip MCU 240, or as analog tuning control signals provided to an ADC (not shown in FIG. 2) of receiver circuit 202 and converted to digital tuning control signals for input to MCU 240. On-chip MCU 240 controls the fine tuning of LO 250 based on the digital RF tuning control signals to enable the receiver circuit 202 to tune to the desired channel. As shown, MCU 240 is also coupled to control LO 250 based on a sensed temperature of integrated receiver circuit 202 provided by an on-chip temperature sensor 244 and based on one or more sensed process parameter/s, e.g., in this example voltage of external receiver system power supply battery 248 provided by on-chip battery voltage sensor 246. It will be understood that in other embodiments voltage of other types of receiver system power supplies (e.g., AC adapter, line voltage, etc.) may be similarly monitored for the same purpose.

In the illustrated embodiment, MCU 240 is configured to retrieve a pre-determined oscillator control value stored in on-chip memory 242 that corresponds to the currently sensed temperature and optional process parameter/s (e.g., stored in a look-up table of temperature versus frequency compensation, or in a more complex look up table of temperature versus frequency compensation for multiple sensed process parameter values), and to use the retrieved oscillator control value, at least in part, to determine and provide a control signal for controlling a frequency of controllable LO 250 for mixing with the incoming RF signal to enable receiver circuit 202 to accurately tune to the desired frequency input by the user. MCU 202 then provides frequency display signals based on the oscillator control value to off-chip digital display device 232 (e.g., LED display, LCD display, etc.) which correspond to the desired frequency selected by the user and that has been accurately tuned to by receiver circuit 202. Off-chip digital display device 232 then displays this currently tuned frequency to the user without the presence or use of any timing reference external to receiver circuit 202 (e.g., such as external microcontroller unit, crystal oscillator, reference clock, etc.). In a further embodiment, the temperature and process compensated frequency of LO 250 may be used to provide an accurate reference clock to digital display device 232 or other components of receiver system, e.g., by MCU 240 or in any other suitable fashion.

Although a single MCU 240 is illustrated, it will be understood that the tasks of MCU 240 described herein may be performed by any suitably programmed processing device (e.g., microcontroller, controller, processor, application specific integrated circuit, filed programmable gate array, etc.) or group of suitable processing devices. It will also be understood that one or more of the tasks, functions, or methodologies of MCU 240 described herein may be implemented, for example, as firmware or other computer program of instructions embodied in a tangible computer readable medium that is executed by a CPU, microcontroller, or other suitable processing device.

Examples of sensors and corresponding optional process parameters that may be measured and used to control LO 250 include, but are not limited to, one or more threshold voltages at nominal temperature, capacitance (e.g., oxide associated with the capacitors), resistance of interconnects or circuit elements, mobility, mechanical stressing of the silicon, aging effects, other process dependent parameters of interest, etc. Further information on measurement of process parameters and use of same may be found described in U.S. Pat. No. 7,332,975, which is incorporated herein by reference in its entirety.

In one embodiment of the disclosed systems and methods, a controllable local oscillator may be controlled to produce a desired oscillator frequency by compensating for changing conditions of temperature (and optionally other process parameters), and to output a digital display representative of the identity of a resulting tuned radio frequency for digital display devices having an accuracy greater than about 5000 parts per million (ppm) over consumer electronic temperature ranges (e.g., from about −20° C. to 85° C. generally), and in another embodiment for digital display devices used in FM applications (where the channel spacing is usually from 50 kHz to 200 kHz at frequencies around about 100 MHz) and having accuracy ranging from about 1000 ppm down to about 250 ppm. However, it will be understood that the disclosed systems and methods may be implemented for generating a digital display signal for digital display devices having accuracies less than or equal to about 5000 ppm and greater than about 250 ppm.

Figure 3:
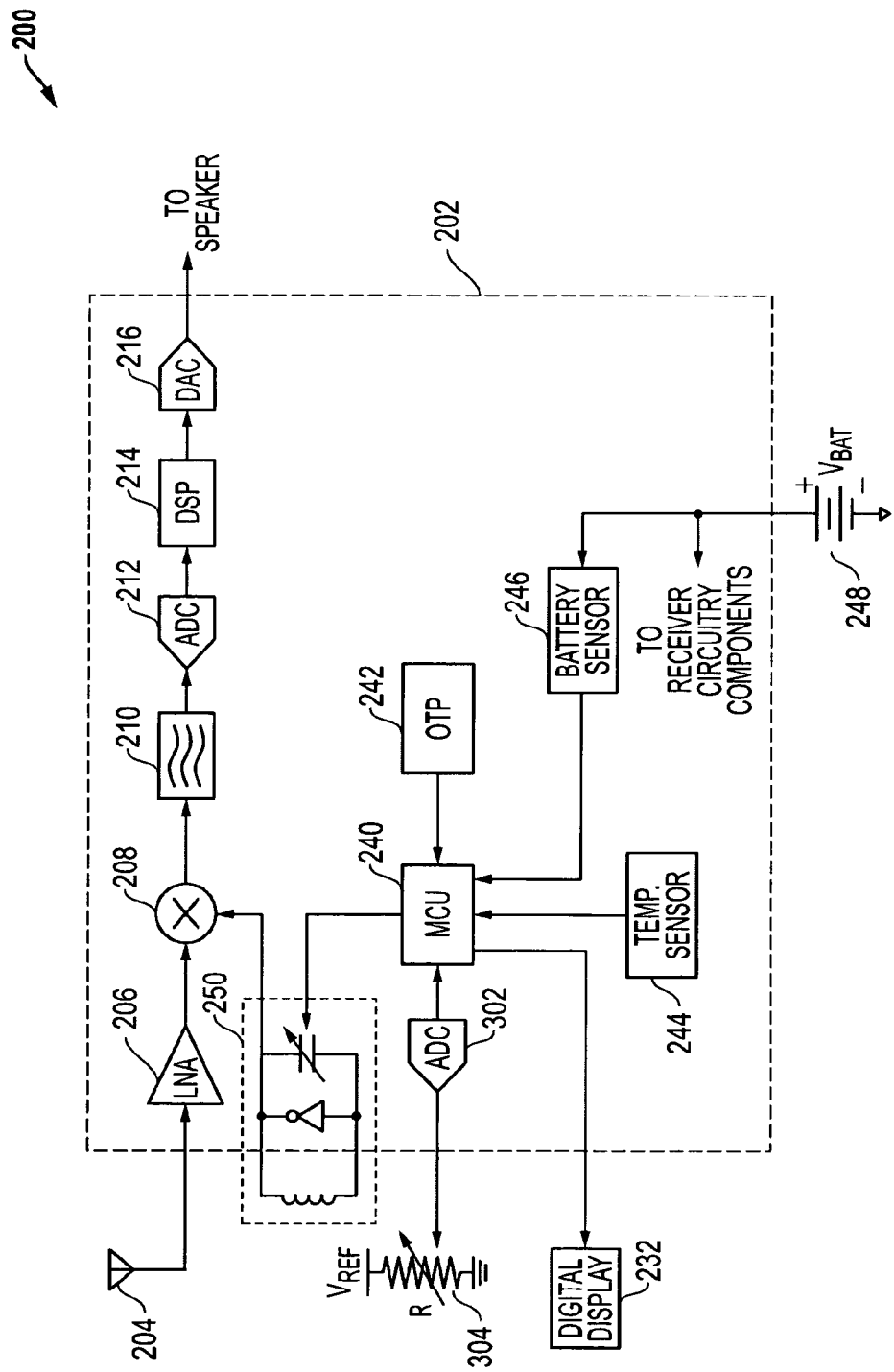
FIG. 3 is a simplified block diagram of a radio receiver system according to one exemplary embodiment of the disclosed systems and methods.

FIG. 3 illustrates one exemplary implementation of receiver system 200 in which free running controllable LO 250 is implemented as an open loop voltage controlled oscillator (VCO) having a tunable capacitor that is controlled by MCU 240' based on a combination of the digital RF tuning control signals, sensed temperature of integrated receiver circuit 202 from on-chip temperature sensor 244 and voltage of external battery 248 provided by on-chip battery voltage sensor 246. In other embodiments LO 250 may be, for example, a LC based oscillator circuit having bondwire inductor, an integrated inductor LC based VCO, an RC based VCO architecture, a ring oscillator based architecture, or any other type of free running oscillator circuit. It will be understood that that other types of controllable oscillators may be used, and a controllable oscillator may be incorporated directly into the die, or a portion of the oscillator (e.g., the inductor or a portion thereof) may be formed external to the die and included in the packaged integrated circuit, e.g., as illustrated in FIG. 3.

In the illustrated embodiment of FIG. 3, user tuning input is accomplished by a variable resistance tuning mechanism (e.g., potentiometer coupled between reference voltage and ground potential) 304 that is adjusted, for example, by a user tuning wheel to provide a variable voltage to ADC 302. ADC 302 converts the particular variable voltage provided at any given time into a digital representation (e.g., code corresponding to a desired RF tuning frequency) that is provided as a RF tuning control signal to MCU 240. It will be understood that in other embodiments, user tuning input may be provided using any other suitable type of tuning mechanism, e.g., a digital RF tuning control signal may be provided directly from an off-chip digital interface or ADC to MCU 240, or a signal of variable capacitance value may be provided directly as an analog RF tuning control signal to MCU 240 (e.g., from user tuning wheel) without the need for ADC 302, in which case MCU 240 may be configured to sense the value of the variable capacitance as a RF tuning control signal that is used to determine the desired frequency for tuning. In those embodiments where analog tuning control signals are provided to receiver circuit 202, receiver system 200 requires no MCU or other processing device external to receiver circuit 202.

Still referring to FIG. 3, memory 242 is provided in this embodiment as one time programmable (OTP) non-volatile memory that contains oscillator control values in the form of VCO capacitor setting values for the tunable capacitor of VCO 250 (e.g., look up table of VCO capacitor setting values expressed as a function of VCO oscillator frequencies versus measured temperature and process parameters such as battery voltage). These stored oscillator control values are used by MCU 240 to control the tunable capacitor of VCO 250 to achieve a proper oscillation frequency of VCO 250 for mixing with the incoming RF signal that is operable to result in receiver circuit 202 tuning to the desired radio frequency input by the user. These stored oscillator control values may also be used to display the correct tuned radio frequency on digital display device 232 without the use of any timing reference external to receiver circuit 202, and in one embodiment without the presence of any MCU or other processor that is external to receiver circuit 202. In this regard, MCU 240 is configured to access OTP memory 242 and to retrieve the oscillator control value that corresponds to the VCO oscillation frequency required to yield the desired user input radio frequency when mixed with the incoming RF signal, taking into consideration the currently measured temperature, battery voltage, and/or any other selected process parameters. Although not shown, an optional programmable divider circuit may be coupled to receive the output of VCO 250 and to divide the output of VCO 250 by a divider value (N) to adjust the output of VCO 250 to achieve a desired range of target oscillation frequencies.

Figure 4:
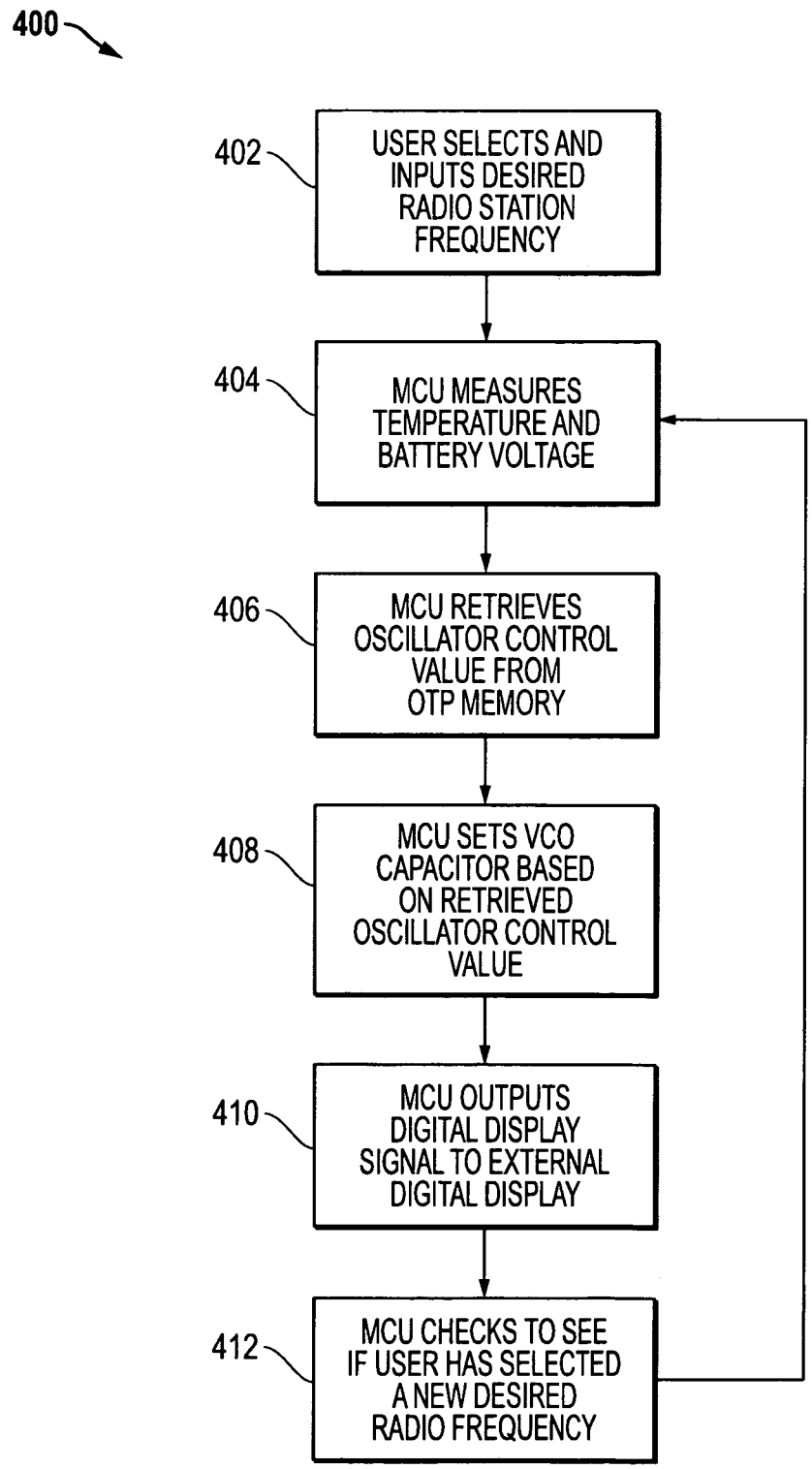
FIG. 4 is a simplified block diagram of methodology that may be implemented according to one exemplary embodiment of the disclosed systems and methods.

FIG. 4 illustrates methodology 400 that may be implemented by radio receiver system 200 of FIG. 3 to tune to the desired radio frequency based on a user input, and to output a digital display signal representative of the tuned radio frequency for display on external digital display device 232 without the use of any external timing reference. As shown, methodology 400 starts in step 402 where a user selects and inputs a desired radio station frequency to receiver circuit 202, e.g., via analog or digital RF tuning control signal to MCU 240 input using a mechanical tuning knob, or alternatively a digital RF tuning signal directly to MCU 240 via external digital tuning selection circuitry. Next, in step 404, MCU 240 measures the current on-chip temperature and voltage of external battery 248. In step 406, MCU 240 accesses stored oscillator control values contained in OTP memory 242 (e.g., in a stored look up table of oscillator frequency versus temperature at various multiple sensed battery voltages) and selects an oscillator control value from memory 242 that corresponds to the needed VCO oscillation frequency at the particular current conditions of temperature and battery voltage measured in step 404. In step 408, MCU 240 then uses the retrieved oscillator control value to set the tunable capacitor of VCO 250 to achieve a VCO oscillation frequency for mixing with the incoming RF signal that allows receiver circuit 202 to accurately tune to the desired radio frequency, and outputs a digital display signal in step 410 to external digital display device 232 that causes display 232 to display the user-selected desired frequency to which the receiver circuit 202 is now accurately tuned. MCU 240 then checks in step 412 to see if the user has selected a new desired radio frequency. As shown in FIG. 4, MCU 240 continues to monitor sensed temperature and battery voltage, and repeats steps 404 to 412 to make adjustments to capacitor setting of VCO 250 as necessary to compensate for changes in temperature and/or voltage, and/or to implement VCO oscillation frequency changes in response to change in user-selected desired radio frequency.

It will be understood that methodology 400 is exemplary only, and that other combinations and sequences of the same or additional steps may be employed. Further, it will be understood that the methodology 400 may be implemented with other embodiments of radio receiver systems (e.g., having other types of controllable LO circuitry components) to accurately tune a radio receiver system and to digitally display RF tuning information therefor. Examples of types of suitable controllable oscillator circuitry and oscillator control values that may be employed in the practice of the disclosed systems and methods are described in U.S. Pat. No. 7,332,975, which is incorporated herein by reference in its entirety.

Figure 5:
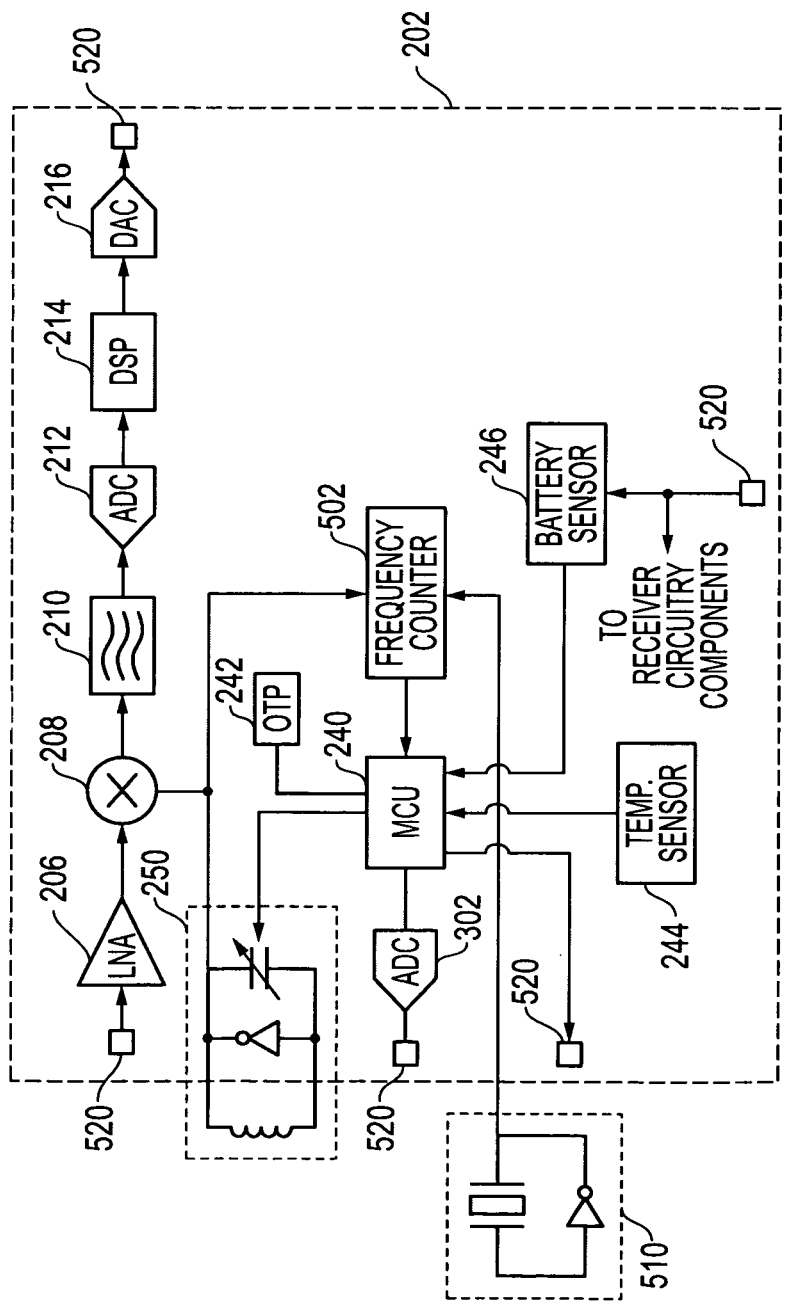
FIG. 5 is a simplified block diagram of a radio receiver system as it may be characterized by calibration according to one exemplary embodiment of the disclosed systems and methods.

FIG. 5 shows receiver circuit 202 as it may be calibrated (e.g., prior to shipment and/or assembly into a receiver system 200) for temperature and process parameter compensation of VCO 250 according to one exemplary embodiment of the disclosed systems and methods. Such a calibration procedure may be performed to heavily characterize VCO 250 by determining oscillator control values that correspond to given frequencies of VCO 250 at varying values of chip temperature and at the varying process parameter of battery voltage.

In the illustrated embodiment of FIG. 5, receiver circuit 202 is a single die integrated receiver circuit having multiple pins 520 for connection to off-chip external circuitry of a receiver system 200, e.g., the external circuitry components of which are illustrated in FIG. 3. As shown in FIG. 5, an external reference, in this case crystal oscillator circuit 510, is temporarily coupled as shown to frequency counter circuitry 502 provided on the die of receiver circuit 202. This may be done, for example, after die fabrication but before shipment or further assembly into a receiver system. In this configuration, a timing signal from crystal oscillator circuit 510 is provided to frequency counter 502 of receiver circuit 202 to provide a reference for measuring the actual oscillation frequency of VCO 250 under a variety of conditions that includes a combination of different temperatures and battery voltages for a range of minimum to maximum VCO frequency settings. This measured VCO frequency information is used to calculate a relationship between oscillator control values (in this embodiment capacitor setting values for VCO 250) and actual VCO oscillation frequencies at various combinations of temperature and battery voltage. This relationship is then stored (e.g., as a look up table) in OTP memory 242.

While the invention may be adaptable to various modifications and alternative forms, specific embodiments have been shown by way of example and described herein. However, it should be understood that the invention is not intended to be limited to the particular forms disclosed. Rather, the invention is to cover all modifications, equivalents, and alternatives falling within the spirit and scope of the invention as defined by the appended claims. Moreover, the different aspects of the disclosed systems and methods may be utilized in various combinations and/or independently. Thus the invention is not limited to only those combinations shown herein, but rather may include other combinations.

What is claimed is:

1. Integrated receiver circuitry comprising:
   on-chip mixer circuitry configured to receive a radio frequency (RF) signal and to mix the RF signal with a local oscillator (LO) signal to produce a downconverted signal;
   at least partially on-chip LO circuitry coupled to provide the LO signal to the mixer to produce the downconverted signal;
   at least one on-chip processing device configured to receive a RF tuning control signal representative of a selected radio frequency, the processing device being coupled to the LO circuitry and coupled to control the frequency of the LO signal with an oscillator control value operable to downconvert the selected radio frequency without consideration of a crystal oscillator and without consideration of an external off-chip timing reference, the oscillator control value being selected based at least in part on measured temperature; and
   on-chip memory circuitry coupled to the at least one processing device, the memory circuitry containing oscillator control information that includes the oscillator control value corresponding to the selected radio frequency at the measured temperature;
   wherein the at least one processing device is configured to access the memory circuitry and to select the oscillator control value based at least in part on the measured temperature, and is further configured to output a digital display signal based on the selected radio frequency without consideration of a crystal oscillator and without consideration of an external off-chip timing reference, the digital display signal containing digital display information that represents the identity of the radio frequency of the downconverted signal.

2. The receiver circuitry of claim 1, wherein the at least one processing device is configured to access the memory and select the oscillator control value based at least in part on measured temperature and at least one measured process parameter; and wherein the memory circuitry contains oscillator control information that includes the oscillator control value corresponding to the selected radio frequency at the measured temperature and measured value of the process parameter.

3. The receiver circuitry of claim 2, wherein the at least one measured process parameter comprises voltage.

4. The receiver circuitry of claim 1, wherein the mixer circuitry, LO circuitry, at least one processing device and memory are each integrated on-chip as part of a single die integrated receiver circuit.

5. The receiver circuitry of claim 4, further comprising on-chip frequency counter circuitry coupled to the LO circuitry and to the at least one processor, the frequency counter circuitry being integrated on-chip as part of the single die integrated receiver circuit; wherein the frequency counter circuitry is further configured for temporary coupling to receive a timing signal from a timing reference external and off-chip to the single die integrated receiver circuit and to use the external off-chip timing signal to measure the actual oscillation frequency of the LO circuitry at a plurality of different temperatures for a range of minimum to maximum frequency settings of the LO circuitry for calculation and storage in the memory circuitry of the oscillator control information as a relationship between oscillator control values and actual oscillation frequencies of the LO circuitry at the plurality of temperatures.

6. The receiver circuitry of claim 4, further comprising an on-chip temperature sensor coupled to provide the measured temperature to the at least one processing device, the temperature sensor being integrated on-chip as part of the single die integrated receiver circuit.

7. The receiver circuitry of claim 4, wherein the at least one processing device is configured to access the memory and select the oscillator control value based at least in part on measured temperature and measured battery voltage; wherein the memory circuitry contains oscillator control information that includes the oscillator control value corresponding to the selected radio frequency at the measured temperature and measured battery voltage; wherein the receiver circuitry further comprises an on-chip voltage sensor coupled to provide the measured voltage to the at least one processing device; and wherein the voltage sensor is integrated on-chip as part of the single die integrated receiver circuit.

8. The receiver circuitry of claim 1, where the RF tuning control signal representative of a selected radio frequency is an analog RF tuning control signal.

9. The receiver circuitry of claim 8; where the analog RF tuning control signal is a variable capacitance signal provided from off-chip.

10. The receiver circuitry of claim 1, where the RF tuning control signal representative of a selected radio frequency is a digital RF tuning control signal; and where the integrated circuitry further comprises on-chip analog-to-digital conversion circuitry configured to receive an analog RF tuning control signal from off-chip, and to convert the received analog RF tuning input into the digital RF tuning control signal that is provided to the at least one on-chip processing device.

11. The receiver circuitry of claim 10, where the analog RF tuning control signal is a variable voltage signal provided from off-chip.

12. The circuitry of claim 1, where the receiver circuitry includes no crystal oscillator or external off-chip timing reference.

13. The circuitry of claim 1, where the at least one processing device is configured to output the digital display signal to display the identity of a correct tuned radio frequency on a digital display device without the presence of any controller or processor that is external to the receiver circuit.

14. A receiver system, comprising:
at least one antenna configured to receive radio frequency (RF) signals;
a tuning mechanism configured to accept RF tuning input from a user;
a digital display device configured to display the identification of a selected radio frequency;
integrated receiver circuitry coupled to the antenna, tuning mechanism and digital display, the receiver circuitry comprising:
on-chip mixer circuitry configured to receive a RF signal provided by the antenna and to mix the RF signal with a local oscillator (LO) signal to produce a downconverted signal,
at least partially on-chip LO circuitry coupled to provide the LO signal to the mixer to produce the downconverted signal,
at least one on-chip processing device configured to receive a RF tuning control signal representative of a selected radio frequency input by a user via the tuning mechanism, the processing device being coupled to the LO circuitry and coupled to control the frequency of the LO signal with an oscillator control value operable to downconvert to the selected radio frequency without consideration of a crystal oscillator and without consideration of an external off-chip timing reference, the oscillator control value being selected based at least in part on measured temperature, and
on-chip memory circuitry coupled to the at least one processing device, the memory circuitry containing oscillator control information that includes the oscillator control value corresponding to the selected radio frequency at the measured temperature,
wherein the at least one processing device is configured to access the memory circuitry and to select the oscillator control value based at least in part on the measured temperature, and is further configured to output a digital display signal to the digital display device based on the selected radio frequency without consideration of a crystal oscillator and without consideration of an external off-chip timing reference, the digital display signal containing digital display information causing the digital display device to display the identity of the radio frequency of the downconverted signal;
where the antenna, tuning mechanism and digital display device are configured as off-chip components of the receiver system.

15. The receiver system of claim 14, wherein the at least one processing device is configured to access the memory and select the oscillator control value based at least in part on measured temperature and at least one measured process parameter; and wherein the memory circuitry contains oscillator control information that includes the oscillator control value corresponding to the selected radio frequency at the measured temperature and measured value of the process parameter.

16. The receiver system of claim 15, further comprising an on-chip power supply coupled to provide power to components of the receiver circuitry, the power supply being coupled to power the receiver circuitry; and wherein the at least one measured process parameter comprises voltage of the power supply.

17. The receiver system of claim 14, wherein the receiver circuitry is a single die integrated receiver circuit that comprises the mixer circuitry, LO circuitry, at least one processing device and memory as on-chip components thereof.

18. The receiver system of claim 17, wherein the receiver circuitry further comprises on-chip frequency counter circuitry coupled to the LO circuitry and to the at least one processor, the frequency counter circuitry being integrated on-chip as part of the single die integrated receiver circuit; wherein the frequency counter circuitry is further configured for temporary coupling to receive a reference timing signal from a timing reference external and off-chip to the single die integrated receiver circuit and to use the external off-chip timing signal to measure the actual oscillation frequency of the LO circuitry at a plurality of different temperatures for a range of minimum to maximum frequency settings of the LO circuitry for calculation and storage in the memory circuitry of the oscillator control information as a relationship between oscillator control values and actual oscillation frequencies of the LO circuitry at the plurality of temperatures.

19. The receiver system of claim 17, wherein the receiver circuitry further comprises a temperature sensor coupled to provide the measured temperature to the at least one processing device, the temperature sensor being integrated on-chip as part of the single die integrated receiver circuit.

20. The receiver system of claim 17, further comprising an off-chip power supply coupled to provide power to components of the receiver circuitry, the power supply being coupled to power the receiver circuitry; wherein the at least one processing device is configured to access the memory and select the oscillator control value based at least in part on measured temperature and measured voltage of the power supply; wherein the memory circuitry contains oscillator control information that includes the oscillator control value corresponding to the selected radio frequency at the measured temperature and measured power supply voltage; wherein the receiver circuitry further comprises a voltage sensor coupled to provide the measured power supply voltage to the at least one processing device; and wherein the voltage sensor is integrated on-chip as part of the single die integrated receiver circuit.

21. The system of claim 14, where the RF tuning control signal representative of a selected radio frequency input by a user via the tuning mechanism is a variable capacitance signal provided from the off-chip tuning mechanism.

22. The system of claim 14, where the RF tuning control signal representative of a selected radio frequency is a digital RF tuning control signal; and where the integrated circuitry further comprises on-chip analog-to-digital conversion circuitry configured to receive a variable voltage signal from the off-chip tuning mechanism, and to convert the received variable voltage signal into the digital RF tuning control signal representative of a selected radio frequency and to provide the digital RF tuning control signal representative of a selected radio frequency to the at least one on-chip processing device.

23. The system of claim 14, where the receiver circuitry includes no crystal oscillator or external off-chip timing reference.

24. The system of claim 14, where the at least one on-chip processing device is coupled to provide the digital display signal to the digital display device to cause the digital display device to display the identity of a correct tuned radio frequency without the presence of any controller or processor that is external to the receiver circuit.

25. A method of using an integrated circuit to display the identity of a tuned radio frequency, comprising performing the following steps on-chip using circuitry of the integrated circuit:
  receiving a RF tuning control signal, the RF tuning control signal being representative of a selected radio frequency;
  mixing a received RF signal with a local oscillator (LO) signal to produce a downconverted signal;
  in response to the received RF tuning control signal selecting an oscillator control value based at least in part on measured temperature from oscillator control information that includes the oscillator control value corresponding to the selected radio frequency at the measured temperature;
  controlling the frequency of the LO signal with the selected oscillator control value to downconvert the selected radio frequency without consideration of a crystal oscillator and without consideration of an external off-chip timing reference; and
  outputting a digital display signal from the integrated circuit based on the selected radio frequency without consideration of a crystal oscillator and without consideration of an external off-chip timing reference, the digital display signal containing digital display information that represents the identity of the radio frequency of the downconverted signal.

26. The method of claim 25, further comprising using the integrated circuit to select the oscillator value based at least in part on measured on-chip temperature and at least one measured process parameter from oscillator control information that includes the oscillator control value corresponding to the selected radio frequency at the measured temperature and measured value of the process parameter.

27. The method of claim 26, wherein the at least one measured process parameter comprises voltage of the power supply for the LO circuitry.

28. The method of claim 25, further comprising performing the steps of receiving, mixing, selecting, controlling and outputting with integrated on-chip components of a single die integrated receiver circuit.

29. The method of claim 28, further comprising obtaining the measured on-chip temperature from a temperature sensor that is integrated on-chip as part of the single die integrated receiver circuit.

30. The method of claim 28, further comprising receiving power for the single die integrated circuit from a power supply; and using circuitry of the integrated circuit to select an oscillator control value based at least in part on measured temperature and measured voltage of the power supply; wherein the oscillator control information includes the oscillator control value corresponding to the selected radio frequency at the measured on-chip temperature and measured power supply voltage.

31. The method of claim 25, further comprising:
  first temporarily using an external off-chip reference timing signal to measure the actual oscillation frequency of LO circuitry at a plurality of different on-chip temperatures for a range of minimum to maximum frequency settings of the LO circuitry to generate the oscillator control information as a relationship between oscillator control values and actual oscillation frequencies of the LO circuitry at the plurality of temperatures; and then
  using circuitry of the integrated circuit to control the LO circuitry with the selected oscillator control value to produce the LO signal having a frequency that downconverts to the selected radio frequency; and outputting the digital display signal from the integrated circuit based on the selected radio frequency without consideration of the external off-chip timing reference signal.

32. The method of claim 25, where the RF tuning control signal representative of a selected radio frequency is an analog RF tuning control signal.

33. The method of claim 32; where the analog RF tuning control signal is a variable capacitance signal provided from off-chip.

34. The method of claim 25, where the RF tuning control signal is a digital RF tuning control signal; and where the method further comprises performing the following steps on-chip using circuitry of the integrated circuit:

receiving an analog RF tuning control signal from off-chip; and converting the received analog RF tuning control signal to the digital RF tuning control signal.

35. The method of claim 34, where the analog RF tuning control signal is a variable voltage signal provided from off-chip.

36. The method of claim 25, where the receiver circuitry includes no crystal oscillator or external off-chip timing reference.

37. The method of claim 25, further comprising outputting the digital display signal from the integrated circuit to a digital display device, the digital display signal containing digital display information that represents the identity of the correct tuned radio frequency of the downconverted signal; and displaying the identity of the correct tuned radio frequency of the downconverted signal based on the digital display signal without the presence of any controller or processor that is external to the integrated circuit.

* * * * *